US007269076B2

(12) United States Patent
Joo et al.

(10) Patent No.: US 7,269,076 B2
(45) Date of Patent: Sep. 11, 2007

(54) LOW POWER CONSUMPTION DATA INPUT/OUTPUT CIRCUIT OF EMBEDDED MEMORY DEVICE AND DATA INPUT/OUTPUT METHOD OF THE CIRCUIT

(75) Inventors: Jong-doo Joo, Sungnam-si (KR); Gyu-hong Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/874,604

(22) Filed: Jun. 23, 2004

(65) Prior Publication Data

US 2005/0057976 A1 Mar. 17, 2005

(30) Foreign Application Priority Data

Sep. 15, 2003 (KR) .................. 10-2003-0063580

(51) Int. Cl.
*G11C 7/10* (2006.01)
(52) U.S. Cl. .................... 365/189.05; 365/230.03; 365/230.06
(58) Field of Classification Search ........... 365/189.05, 365/203, 204, 230.05
See application file for complete search history.

(56) References Cited

U.S. PATENT DOCUMENTS

| | | | | |
|---|---|---|---|---|
| 5,357,474 A | * | 10/1994 | Matano et al. ............ | 365/203 |
| 5,838,990 A | * | 11/1998 | Park et al. ................. | 710/14 |
| 5,973,984 A | * | 10/1999 | Nagaoka ................... | 365/230.03 |
| 6,307,797 B1 | * | 10/2001 | Fournel et al. ........... | 365/203 |
| 6,359,825 B1 | * | 3/2002 | Aimoto et al. ........... | 365/230.03 |
| 6,542,428 B2 | * | 4/2003 | Hidaka ..................... | 365/230.03 |
| 6,906,974 B2 | * | 6/2005 | Jeung ....................... | 365/207 |

* cited by examiner

*Primary Examiner*—Huan Hoang
*Assistant Examiner*—Anthan Tran
(74) *Attorney, Agent, or Firm*—Mills & Onello, LLP

(57) ABSTRACT

A low power consumption data input/output circuit and method includes input/output lines, bit line sense amplifying unit groups, and data input/output units. Each pair of the input/output lines is arranged in each sub memory cell block. The bit line sense amplifying unit groups are connected between the sub memory cell blocks and the pairs of input/output lines and mutually transmit data signals between the sub memory cell blocks and the pairs of input/output lines in response to first control signals. Each data input/output unit is connected to each of input/output line groups each including a first predetermined number of input/output line pairs, selects as a data output path some of the input/output lines included in each input/output line group, pre-discharges the residual input/output lines to a ground voltage, and receives and transmits the data signals to the cell blocks via the selected input/output lines.

16 Claims, 8 Drawing Sheets

LOW POWER CONSUMPTION DATA INPUT/OUTPUT CIRCUIT OF EMBEDDED MEMORY DEVICE AND DATA INPUT/OUTPUT METHOD OF THE CIRCUIT

CROSS REFERENCE TO RELATED APPLICATION

This application claims the priority of Korean Patent Application No. 2003-63580, filed on Sep. 15, 2003, in the Korean Intellectual Property Office, the contents of which are hereby incorporated by reference in their entirety.

BACKGROUND OF THE INVENTION

1. Field of the Invention

The present invention relates to an embedded memory device, and more particularly, to a data input/output (I/O) circuit of an embedded memory device.

2. Description of the Related Art

With the recent demand for an increase in speed of dynamic random access memories (DRAMs), DRAMs are merged into logic circuits, and embedded DRAMs having a wide bandwidth have come into general use. Such embedded DRAMs are previously implemented in the form of a unit macro, so that they can support various storage densities and I/O data widths as desired by users. Also, the embedded DRAMs are designed using compiler techniques to shorten the time required for designing. For example, by using compiler techniques, embedded DRAMs having various I/O data widths such as X4, X16, . . . , X128, and X256 can be designed.

FIG. 1 illustrates a data I/O circuit 1 of a conventional embedded DRAM.

Referring to FIG. 1, sub memory cell blocks MC0 through MC127 that share word lines WL are spaced apart by a predetermined distance. Also, bit line sense amplifying unit groups BG0 through BG127 and I/O lines IO0, IO0B through IO127, IO127B are arranged adjacent to the sub memory cell blocks MC0 through MC127.

In FIG. 1, since the configurations of the sub memory cell blocks MC0 through MC127 are substantially identical, only the sub memory cell blocks MC0 and MC1 are illustrated in detail. Also, since the configurations of the bit line sense amplifying unit groups BG0 through BG127 are substantially identical, only the bit line sense amplifying unit groups BG0 and BG1 are illustrated in detail.

Each of the bit line sense amplifying unit groups BG0 through BG127 includes a plurality of bit line sense amplifying units BS1 through BS8. In FIG. 1, the plurality of bit line sense amplifying units BS1 through BS8 are connected between bit lines BLs and BLBs of the sub memory cell blocks MC0 through MC127 and the I/O lines IO0, IO0B through IO127, IO127B. Data I/O units U1 through U64 are connected to the I/O lines IO0, IO0B through IO127, IO127B, respectively.

The data I/O circuit 1 of a general embedded DRAM, configured as described above, can support various I/O data widths such as X4, X16, . . . , X128 through I/O muxing.

Next, a data I/O circuit of embedded DRAM according to conventional art will be described with reference to FIGS. 2 and 3. FIG. 2 illustrates in detail a portion of the data I/O circuit of embedded DRAM according to conventional art, and FIG. 3 is a timing diagram for signals associated with the data I/O circuit of FIG. 2.

Referring to FIG. 2, in the data I/O circuit of embedded DRAM according to conventional art where I/O lines are 2:1 muxed, two bit line sense amplifying units 10 and 20 and a data I/O unit 30 corresponding thereto are only illustrated.

The bit line sense amplifying units 10 and 20 are respectively connected to bit lines BL0 and BL0B and bit lines BL1 and BL1B of different sub memory cell blocks (MC0 and MC1 of FIG. 1) and share a column selection line (not shown).

The bit line sense amplifying unit 10 includes bit line precharge circuits 11a and 11b, sense amplifying circuits 12a and 12b, and gate circuits 13a and 13b, which are connected to the bit lines BL0 and BL0B. The gate circuits 13a and 13b are also connected to I/O lines IO0 and IO0B.

The bit line sense amplifying unit 20 includes bit line precharge circuit 21a and 21b, sense amplifying circuits 22a and 22b, and gate circuits 23a and 23b, which are connected to the bit lines BL1 and BL1B. The gate circuits 23a and 23b are also connected to I/O lines IO1 and IO1B.

The data I/O unit 30 is connected to an input buffer 40 and an output buffer 50. The data I/O unit 30 includes I/O precharge circuits 31 and 32 and I/O sense amplifier and drivers 33 and 34.

Here, for high-speed data read and write operations, the bit line sense amplifying units 10 and 20 include the gate circuits 13a and 23a that are enabled during a read operation and the gate circuits 13b and 23b that are enabled during a write operation. Also, for a high-speed read operation, the gate circuit 13a generates a current corresponding to a voltage difference between the bit lines BL0 and BL0B and the gate circuit 23a generates a current corresponding to a voltage difference between the bit lines BL1 and BL1B.

For example, when the I/O lines IO0 and IO0B are selected during a read operation, the gate circuit 13a is turned on in response to a column selection signal RCSL. Then, the gate circuit 13a generates the current corresponding to the voltage difference between the bit lines BL0 and BL0B. The current generated by the gate circuit 13a flows into the I/O lines IO0 and IO0B.

At this time, since the gate circuit 23a shares the column selection line (not shown) with the gate circuit 13a, it is also turned on in response to the column selection signal RCSL.

Here, a sub memory cell block (MC0 of FIG. 1) including the bit lines BL0 and BL0B and a sub memory cell block (MC1 of FIG. 1) including the bit lines BL1 and BL1B share word lines (WL of FIG. 1).

Since the word lines are being enabled when the I/O lines IO0 and IO0B are selected, after the gate circuit 23a is turned on, the current, generated by the gate circuit 23a, flows from the bit lines BL1 and BL1B into the I/O lines IO1 and IO1B. As a result, although the I/O lines IO1 and IO1B are not selected, a voltage difference occurs between the I/O lines IO1 and IO1B, as shown in FIG. 3.

Similarly, when the I/O lines IO0 and IO0B are selected during a write operation, the gate circuits 13b and 23b are turned on in response to a column selection signal WCSL. As a result, although the I/O lines IO1 and IO1B are not selected, the current, generated by the gate circuit 23b, flows from the bit lines BL1 and BL1B into the I/O lines IO1 and IO1B. Thus, as shown in FIG. 3, a voltage difference occurs between the I/O lines IO1 and IO1B.

As described above, in the data I/O circuit of embedded DRAM according to conventional art, during the read or write operation, current flows through I/O lines that are not selected, resulting in high power consumption. In particular, power consumption becomes a serious concern when the I/O data width is set to be narrow. For example, in embedded DRAM capable of supporting a maximum I/O data width of X128, when I/O lines are 16:1 muxed and the embedded DRAM are then set to I/O data width X8, the number of I/O lines that are not selected during the read or write operation is much greater than that of I/O lines that are selected during the read or write operation. Thus, power consumption is unnecessarily increased.

SUMMARY OF THE INVENTION

The present invention provides a low power consumption data I/O circuit of an embedded memory device, which reduces power consumption caused by I/O lines that are not selected during a read or write operation, and a data I/O method executed in the low power consumption data I/O circuit.

According to one aspect of the present invention, there is provided a data input/output circuit of an embedded memory device, which includes sub memory cell blocks that share word lines. The data input/output circuit comprises input/output lines, bit line sense amplifying unit groups, and data input/output units.

Each pair of the input/output lines is arranged in each of the sub memory cell blocks. The bit line sense amplifying unit groups are connected between the sub memory cell blocks and the input/output lines and mutually transmit data signals between the sub memory cell blocks and the input/output lines in response to first control signals. Each of the data input/output units is connected to each of input/output line groups each including a first predetermined number of pairs of input/output lines, selects as a data output path some of the pairs of input/output lines included in each of the input/output line groups in response to second control signals, pre-discharges the residual input/output lines to a ground voltage, and receives and transmits the data signals to the sub memory cell blocks via the selected input/output lines.

Each of the data input/output units can include input/output line selection circuits, input/output sense amplifiers and drivers, and an input/output precharge circuit. Each of the input/output line selection circuits is connected between each of the first predetermined number of pairs of the input/output lines and a data input/output line pair and is enabled or disabled in response to muxing signals among the second control signals. The input/output sense amplifiers and drivers amplify read-out data signals received via the data input/output line pair, output the amplified read-out data signals to output buffers, and output write data signals received from input buffers to the data input/output line pair. The input/output precharge circuit precharges the data input/output line pair to an internal voltage or pre-discharges the data input/output line pair to the ground voltage, in response to input/output precharge control signals among the second control signals. When one of the input/output line selection circuits is enabled, the residual input/output line selection circuits are disabled.

The muxing signals can be composed of combinations of column address signals.

When each of the input/output line selection circuits is enabled, it can connect a corresponding pair of input/output lines to the data input/output line pair, and when each of the input/output line selection circuits is disabled, it can disconnect the corresponding pair of input/output lines from the data input/output line pair and pre-discharges the corresponding pair of input/output lines to the ground voltage.

Each of the input/output line selection circuits can include switching circuits and input/output pre-charge circuits. The switching circuits are connected between the pairs of input/output lines and the data input/output line pair and are turned on or off in response to the muxing signals. The input/output pre-discharge circuits pre-discharge the pairs of input/output lines to the ground voltage in response to the muxing signals when the switching circuits are turned off.

In one embodiment, the switching circuits are transmission gates.

The bit line sense amplifying unit groups can share a second predetermined number of column selection lines and each can comprise the second predetermined number of bit line sense amplifying units, each of which is connected to bit lines of the sub memory cell blocks and to an input/output line pair among the first predetermined number of pairs of input/output lines. During a write operation, the second predetermined number of bit line sense amplifying units block a current path formed between the bit lines and the input/output line pair when the input/output line pair is not selected as a data input path by the input/output line selection circuits.

Each of the second predetermined number of bit line sense amplifying units can include bit line precharge circuits, sense amplifying circuits, a first gate circuit, and a second gate circuit. The bit line precharge circuits are connected to a pair of bit lines among the bit lines and precharge the pair of bit lines to a predetermined voltage. The sense amplifying circuits amplify a voltage of the pair of bit lines. During a read operation, the first gate circuit is enabled in response to a first column selection signal and provides a current corresponding to a voltage difference between the pair of bit lines to the input/output line pair to which each of the second number of bit sense amplifying units is connected. During the write operation, the second gate circuit is enabled in response to a second column selection signal and delivers a write data signal received from the input/output line pair to the pair of bit lines. When the input/output line pair is not selected as the data input path, the second gate circuit blocks a current path formed between the pair of bit lines and the input/output line pair.

The second gate circuit can include a gate unit and a current blocking unit. The gate unit is enabled in response to the second column selection signal and delivers the write data signal to the pair of bit lines. The current blocking unit is connected between the input/output line pair to which each of the second number of bit sense amplifying units is connected and the gate unit, delivers the write data signal received from the input/output line pair to the gate unit when the input/output line pair is selected as the data input path, and blocks a current path from the pair of bit lines to the input/output line pair when the input/output line pair is not selected as the data input path.

The current blocking unit can include a plurality of NMOS transistors that are cross coupled to the input/output line pair.

The current blocking unit can include a plurality of NMOS transistors that are diode connected to the input/output line pair.

In one embodiment, the second gate circuit comprises a gate unit and a current blocking unit. The gate unit is enabled in response to the second column selection signal and receives the write data signal from the input/output line pair. The current blocking unit is connected between the gate unit and the pair of bit lines, delivers the write data signal received from the gate unit to the pair of bit lines when the input/output line pair is selected as the data input path, and blocks a current path from the pair of bit lines to the input/output line pair when the input/output line pair is not selected as the data input path.

The current blocking unit can include a plurality of NMOS transistors that are diode connected to output of the gate unit.

According to another aspect of the present invention, there is provided an embedded memory device comprising the data input/output circuit of the invention. The data input/output circuit comprises input/output lines, bit line sense amplifying unit groups, and data input/output units. Each pair of the input/output lines is arranged in each of the sub memory cell blocks. The bit line sense amplifying unit groups are connected between the sub memory cell blocks and the input/output lines and transmit data signals between the sub memory cell blocks and the input/output lines in response to first control signals. Each of the data input/output units is connected to input/output line groups including a first predetermined number of pairs of the input/output lines, selects some of the input/output lines as a data output path in response to second control signals, pre-discharges the residual input/output lines to a ground voltage, and receives and transmits the data signals to the sub memory cell blocks via the selected input/output lines.

According to yet another aspect of the present invention, there is provided a data input/output method executed in a data input/output circuit that includes input/output lines, each pair of which is arranged in each of sub memory cell blocks that share word lines, bit line sense amplifying unit groups that are each connected between bit lines of each of the sub memory cell blocks and a pair of input/output lines corresponding to each of the sub memory cell blocks, and data input/output units that are connected to a predetermined number of pairs of input/output lines. The data input/output method comprises (a) in an initial state, pre-discharging all the input/output lines to a ground voltage, (b) when a read command signal or a write command signal is enabled, selecting some of the input/output lines as a data input/output path and precharging the selected input/output lines to an internal voltage, (c) continuing to pre-discharge the input/output lines that are not selected as the data input/output path in step (b) to the ground voltage, and (d) when an additional read command signal or an additional write command signal is enabled, repeating steps (b) and (c).

In one embodiment, the data input/output method further comprises (e) when the write command signal is enabled in step (b), blocking a current path formed between the bit lines and the input/output lines that are not selected as the data input/output path.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
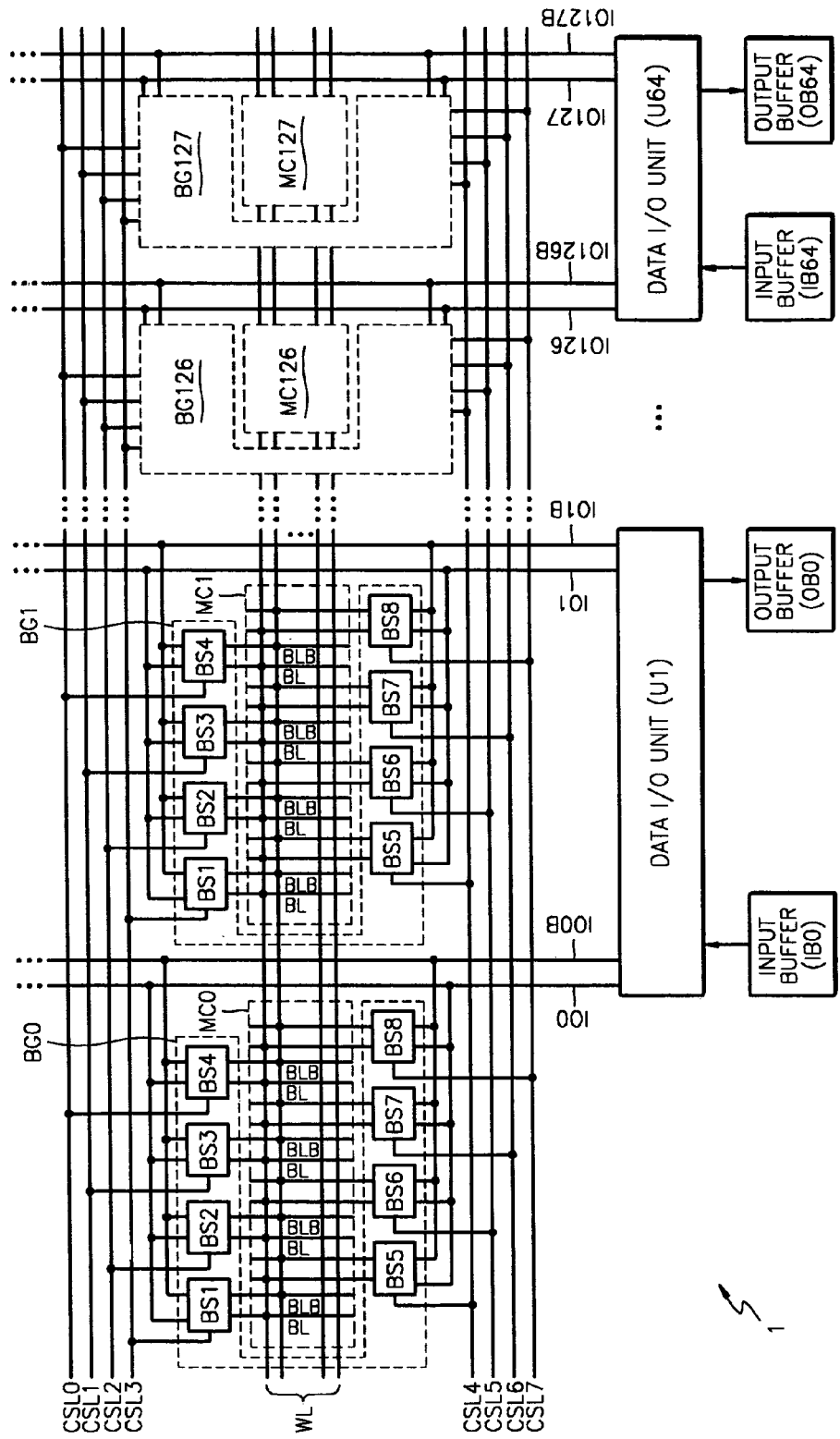
FIG. 1 illustrates a data I/O circuit of a conventional embedded DRAM.
Figure 2:
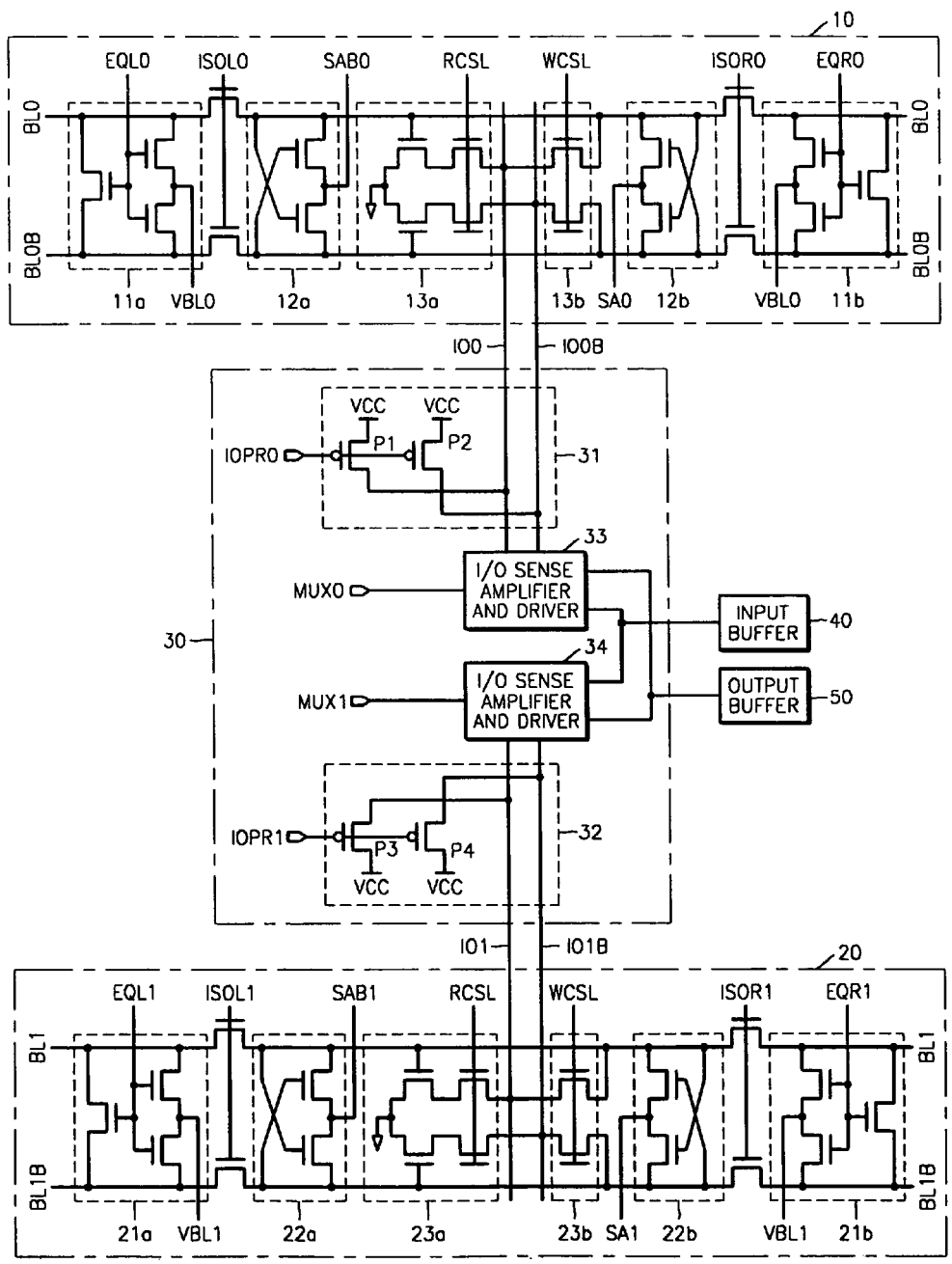
FIG. 2 illustrates in detail a portion of a data I/O circuit of a conventional embedded DRAM.
Figure 3:
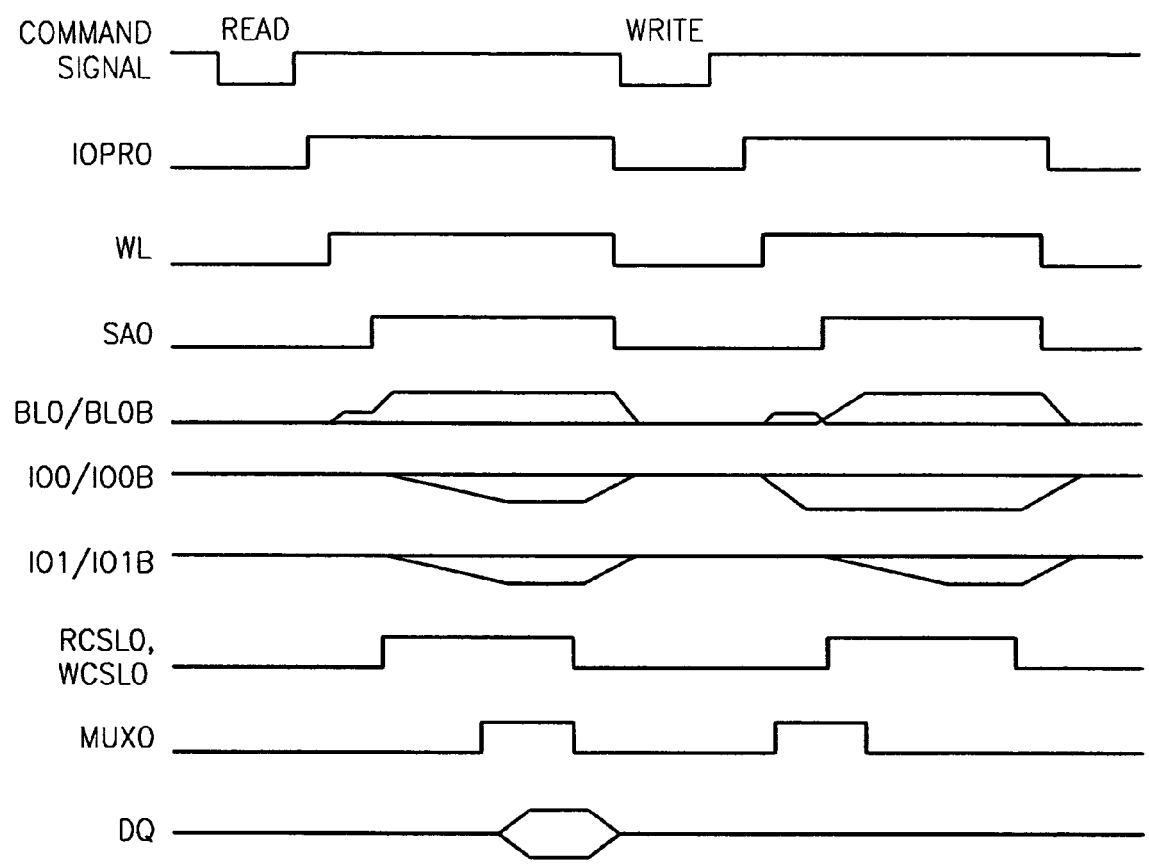
FIG. 3 is a timing diagram illustrating signals associated with the data I/O circuit of FIG. 2.
Figure 4:
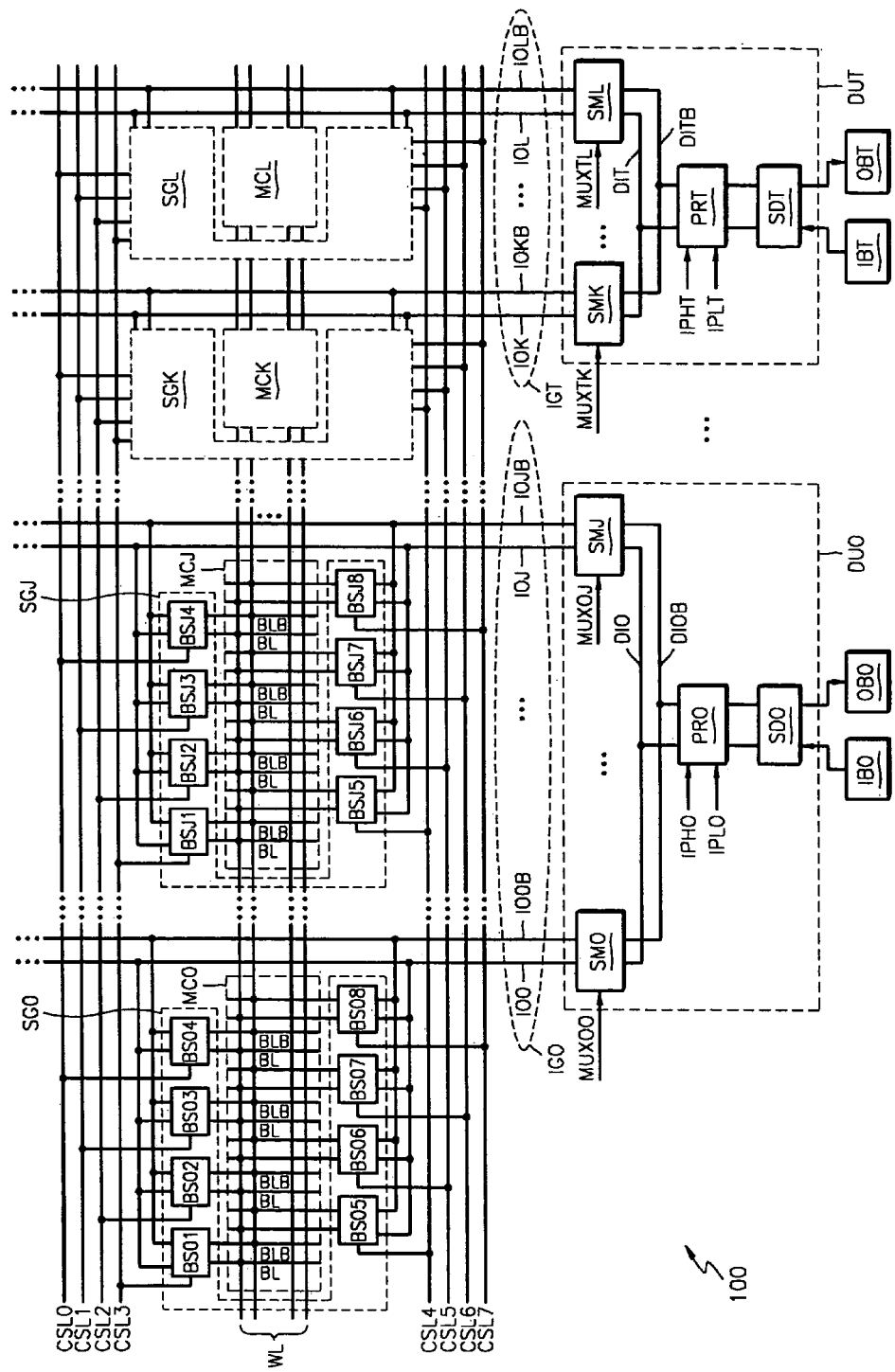
FIG. 4 illustrates a data I/O circuit of an embedded DRAM, according to an embodiment of the present invention.

FIG. 4 illustrates a data I/O circuit 100 of embedded DRAM, according to an embodiment of the present invention.

Referring to FIG. 4, the data I/O circuit 100 includes I/O lines IO0, IO0B through IOL, IOLB (L is a natural number more than 1), bit line sense amplifying unit groups SG0 through SGL, and data I/O units DU0 through DUT (T is a natural number more than 1).

The I/O lines IO0, IO0B through IOL, IOLB and the bit line sense amplifying unit groups SG0 through SGL are arranged adjacent to sub memory cell blocks MC0 through MCL that share word lines WL. Here, one pair of I/O lines and one bit line sense amplifying unit group are arranged adjacent to each of the sub memory cell blocks MC0 through MCL. Also, one bit line sense amplifying unit group is arranged in one sub memory cell block, and one pair of I/O lines are arranged in one bit line sense amplifying unit group.

The bit line sense amplifying unit groups SG0 through SGL are connected to bit lines BLs and BLBs of the sub memory cell blocks MC0 through MCL and the I/O lines IO0, IO0B through IOL, IOLB.

In FIG. 4, since the configurations and operations of the bit line sense amplifying unit groups SG0 through SGL are substantially identical, the bit line sense amplifying unit groups SG0 and SGJ are only illustrated in detail. Thus, descriptions will be focused on the bit line sense amplifying unit groups SG0 and SGJ.

The bit line sense amplifying unit groups SG0 and SGJ respectively include a plurality of bit line sense amplifying units BS01 through BS08 and a plurality of bit line sense amplifying units BSJ1 through BSJ8 (J is a natural number more than 1). To be more specific, for example, the bit line sense amplifying unit group SG0 includes 8 bit line sense amplifying units BS01 through BS08. Here, the number of bit line sense amplifying units included in one bit line sense amplifying unit group may vary.

Also, the bit line sense amplifying unit groups SG0 through SGL are arranged in the column direction above and under the sub memory cell blocks MC0 through MCL and share column selection lines CSL0 through CSL7.

For example, the bit line sense amplifying units BS01 through BS04 and BSJ1 through BSJ4 are arranged in the column direction above the sub memory cell blocks MC0 through MCJ and share the column selection lines CSL0 through CSL3.

Also, the bit line sense amplifying units BS05 through BS08 and BSJ5 through BSJ8 are arranged in the column direction under the sub memory cell blocks MC0 through MCJ and share the column selection lines CSL4 through CSL7.

Although eight column selection lines CSL0 through CSL7 are illustrated in FIG. 4, the number of column selection lines may be equal to that of bit line sense amplifying units included in one bit line sense amplifying unit group.

Therefore, as the number of bit line sense amplifying units included in one bit line sense amplifying unit group increases, the number of column selection lines also increases.

The bit line sense amplifying units BS01 through BS08 and BSJ1 through BSJ8 amplify read-out data signals received from the bit lines BLs and BLBs of the sub memory cell blocks MC0 through MCJ and output the resulting signals to the I/O lines IO0, IO0B through IOJ, IOJB.

Also, the bit line sense amplifying units BS01 through BS08 and BSJ1 through BSJ8 output write data signals received from the I/O lines IO0, IO0B through IOJ, IOJB to the bit lines BLs and BLBs of the sub memory cell blocks MC0 through MCJ.

The detailed configurations and operation of the bit line sense amplifying units BS01 through BS08 and BSJ1 through BSJ8 will be described with reference to FIGS. 5, 7, and 8.

Each of the data I/O units DU0 through DUT is connected to each of I/O line groups IG0 through IGT. Each of the I/O line groups IG0 through IGT includes a plurality of I/O lines IO0, IO0B through IOJ, IOJB, . . . , IOK, IOKB through IOL, IOLB (K is a natural number more than 2).

Here, the number of I/O lines included in one I/O line group may vary with predetermined data I/O bandwidths.

For example, it is assumed that the data I/O circuit 100 includes 128 pairs of I/O lines IO0, IO0B through IO127, IO127B and can support a maximum data I/O width of X128. Then, if a data I/O width of the data I/O circuit 100 is set to X16, it can be seen that the number of pairs of I/O lines included in one I/O line group is eight.

That is, eight pairs of I/O lines IO0, IO0B through IO7, IO7B, . . . , IO120, IO120B through IO127, IO127B are connected to each of 16 data I/O units DU0 through DU15. Each of the data I/O units DU0 through DU15 selects a pair of I/O lines as a data I/O path from among the eight pairs connected to each of the data I/O units DU0 through DU15.

Each of the data I/O units DU0 through DUT includes a plurality of I/O line selection circuits SMO through SMJ, . . . , SMK through SML, I/O precharge circuits PR0 through PRT, and I/O sense amplifiers and drivers SD0 through SDT. Here, the number of I/O line selection circuits included in one data I/O unit is equal to that of pairs of I/O lines included in one I/O line group.

The I/O line selection circuits SM0 through SMJ and SMK through SML are connected to the I/O lines IO0, IO0B through IOJ, IOJB, . . . , IOK, IOKB through IOL, IOLB.

Also, the I/O line selection circuits SM0 through SMJ, . . . , SMK through SML are connected to the I/O sense amplifiers and drivers SD0 through SDT via data I/O (DIO) lines DI0, DI0B through DIT, DITB. To be more specific, for example, the I/O line selection circuits SM0 through SMJ are connected to the I/O sense amplifier and driver SD0 via the DIO lines DI0 and DI0B.

The I/O line selection circuits SM0 through SMJ, . . . , SMK through SML are enabled or disabled in response to muxing signals MUX00 through MUX0J and MUXTK through MUXTL. The muxing signals MUX00 through MUX0J and MUXTK through MUXTL can be made up of combinations of separate column address signals applied from the outside.

At this time, one of I/O line selection circuits included in each of the data I/O units DU0 through DUT is only enabled.

For example, in the case of the data I/O unit DU0, when the I/O line selection circuit SM0 is enabled, the other I/O selection circuits SM1 through SMJ all are disabled.

During the read operation, the I/O line selection circuit SM0 outputs read-out data signals received from the I/O lines IO0 and IO0B to the DIO lines DI0 and DI0B. During the write operation, the I/O line selection circuit SM0 outputs write data signals received from the DIO lines DI0 and DI0B to the I/O lines IO0 and IO0B.

The other I/O line selection circuits SM1 through SMJ disconnect the I/O lines IO1, IO1B through IOJ, IOJB from the DIO lines DI0 and DI0B and pre-discharge the I/O lines IO1, IO1B through IOJ, IOJB to a ground voltage. As a result, power consumption caused by the I/O lines IO1, IO1B through IOJ, IOJB that are not selected is reduced.

The detailed configurations and operation of the I/O line selection circuits SM1 through SMJ will be described below with reference to FIG. 5.

Next, the I/O sense amplifiers and drivers SD0 through SDT amplify read-out data signals received from the DIO lines DI0, DI0B through DIT, DITB and outputs the resulting signals to output buffers OB0 through OBT. Also, the I/O sense amplifiers and drivers SD0 through SDT output the write data signals received from input buffers IB0 through IBT to the DIO lines DI0, DI0B through DIT, DITB.

Each of the I/O precharge circuits PR0 through PRT is connected to each pair of DIO lines DI0, DI0B through DIT, DITB. In response to control signals IPH0, IPL0 through IPHT, IPLT, the I/O precharge circuits PR0 through PRT pre-discharge the DIO lines DI0, DI0B through DIT, DITB to the ground voltage or pre-charge the DIO lines DI0, DI0B through DIT, DITB to an internal voltage VCC.

Next, the bit line sense amplifying units BS01 through BSJ8 and the data I/O unit DU0 will be described in detail with reference to FIG. 5. FIG. 5 illustrates in detail a portion of the data I/O circuit 100 of FIG. 4.

Figure 5:
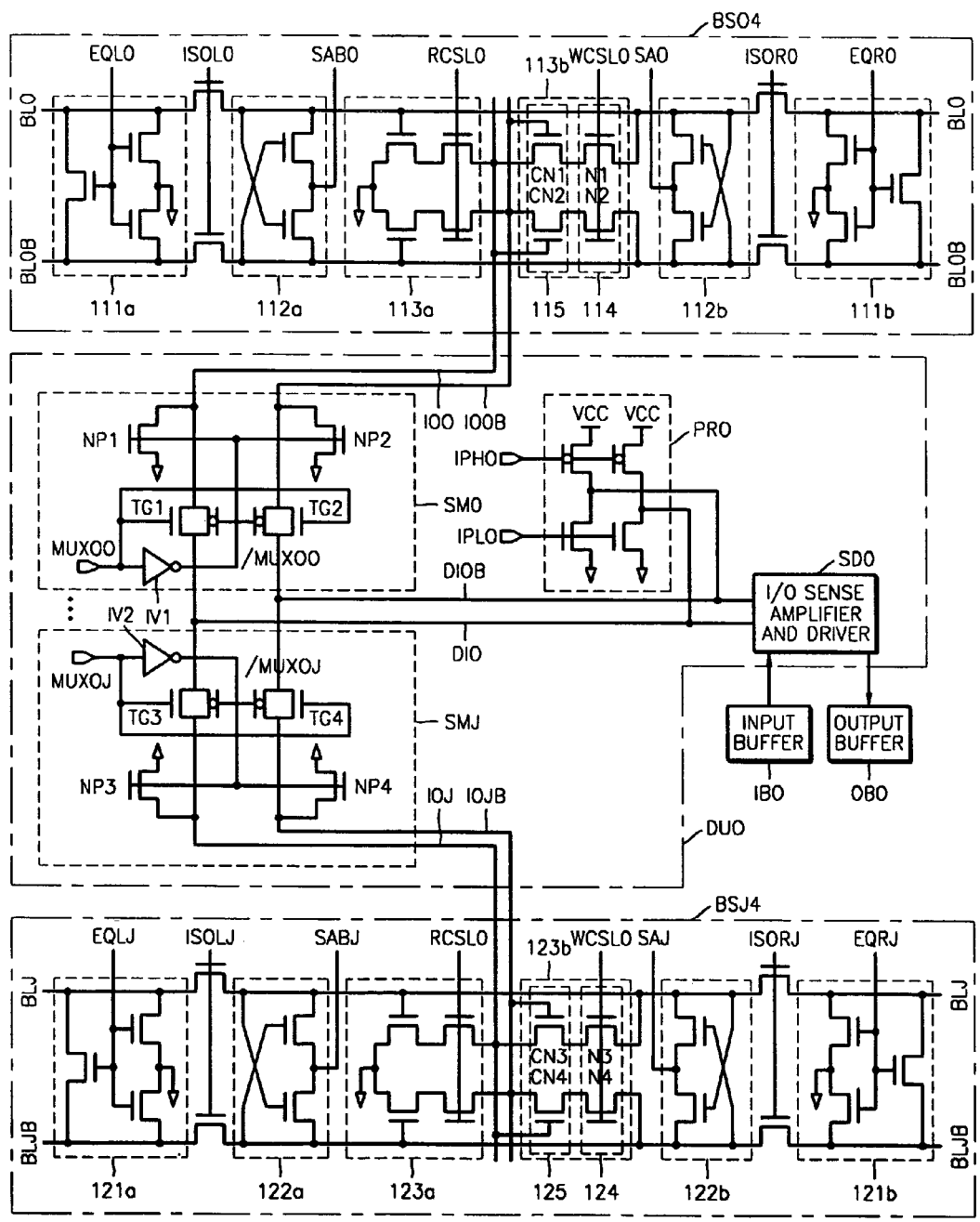
FIG. 5 illustrates in detail a portion of the data I/O circuit of FIG. 4.

In FIG. 5, for brevity, only the bit line sense amplifying units BS04 and BSJ4 and the data I/O unit DU0 are illustrated. The configurations and operation of the other bit line sense amplifying units and data I/O units are identical to the bit line sense amplifying units BS04 and BSJ4 and the data I/O unit DU0 and, therefore their description will not be repeated.

The bit line sense amplifying unit BS04 is connected to the bit lines BL0 and BL0B and the I/O lines IO0 and IO0B and the bit line sense amplifying unit BSJ4 is connected to the bit lines BLJ and BLJB and the I/O lines IOJ and IOJB.

The bit line sense amplifying unit BS04 includes bit line precharge circuits 111*a* and 111*b*, sense amplifying circuits 112*a* and 112*b*, and gate circuits 113*a* and 113*b*, which are connected to the bit lines BL0 and BL0B. The configurations and operations of the bit line precharge circuits 111*a* and 111*b* and sense amplifying circuits 112*a* and 112*b* can be understood by those skilled in the art.

The gate circuit 113*a* is connected to the I/O lines IO0 and IO0B and enabled or disabled in response to a column selection signal RCSL0. When the gate circuit 113*a* is enabled, it provides a current corresponding to a voltage difference between the bit lines BL0 and BL0B to the I/O lines IO0 and IO0B.

The gate circuit 113*b* includes a gate unit 114 and a current blocking unit 115. The gate unit 114 is enabled in response to a column selection signal WCSL0 during the write operation and delivers a write data signal received from the current blocking unit 115 to the bit lines BL0 and BL0B.

When the I/O lines IO0 and IO0B are not selected by the data I/O unit DU0 during the write or read operation, the current blocking unit 115 blocks the current that flows from the bit lines BL0 and BL0B to the I/O lines IO0 and IO0B.

The gate unit 114 includes NMOS transistors N1 and N2 and the current blocking unit 115 includes NMOS transistors CN1 and CN2.

Sources of the NMOS transistors N1 and N2 are connected to the bit lines BL0 and BL0B, drains of the NMOS transistors N1 and N2 are connected to sources of the NMOS transistors CN1 and CN2, and the column selection signal WCSL0 is input to gates of the NMOS transistors N1 and N2.

Also, a gate of the NMOS transistor CN1 is connected to the I/O line IO0B and a drain of the NMOS transistor CN1 is connected to the I/O line IO0. A gate of the NMOS transistor CN2 is connected to the I/O line IO0 and a drain of the NMOS transistor CN2 is connected to the I/O line IO0B.

The I/O line IO0 is at the internal voltage VCC level and the I/O line IO0B is at the ground voltage VSS level, the NMOS transistor CN2 is turned on. At this time, the NMOS transistor CN1 is turned off.

The NMOS transistor CN2 outputs a write data signal of the ground voltage VSS level, received from the I/O line IO0B, to the NMOS transistor N2. The NMOS transistor N2 outputs the write data signal to the bit line BL0B. Also, since the NMOS transistor CN1 is turned off, the bit line BL0 is floated.

In contrast, when the I/O line IO0B is at the internal voltage VCC level and the I/O line IO0 is at the ground voltage VSS level, the NMOS transistor CN1 is turned on. At this time, the NMOS transistor CN2 is turned off.

The NMOS transistor CN1 outputs a write data signal of the ground voltage VSS level, received from the I/O line IO0, to the NMOS transistor N1. The NMOS transistor N1 outputs the write data signal to the bit line BL0. Also, since the NMOS transistor CN2 is turned off, the bit line BL0B is floated.

The bit line sense amplifying unit BSJ4 includes bit line precharge circuits 121a and 121b, sense amplifying circuits 122a and 122b, and gate circuits 123a and 123b, which are connected to the bit lines BLJ and BLJB. Also, the gate circuit 123b includes a gate unit 124 and a current blocking unit 125. The gate unit 124 includes NMOS transistors N3 and N4 and the current blocking unit 125 includes NMOS transistors CN3 and CN4.

Here, the detailed configuration and operation of the bit line sense amplifying unit BSJ4 are identical to the bit line sense amplifying unit BS04 and their description will not be repeated.

Next, the data I/O unit DU0 includes the I/O line selection circuits SM0 through SMJ, the I/O precharge circuit PR0, and the I/O sense amplifier and driver SD0. In FIG. 5, since only the bit line sense amplifying units BS04 and BSJ4 are illustrated, descriptions will be focused on the I/O line selection circuits SM0 and SMJ corresponding to the bit line sense amplifying units BS04 and BSJ4.

The I/O line selection circuit SM0 includes transmission gates TG1 and TG2, NMOS transistors NP1 and NP2, and an inverter IV1. The inverter IV1 inverts a muxing signal MUX00 and outputs an inverted muxing signal /MUX00. The transmission gates TG1 and TG2 are respectively connected between the I/O line IO0 and the DIO line DIO and the I/O line IO0B and the DIO line DI0B. The transmission gates TG1 and TG2 are respectively turned on or off in response to the muxing signal MUX00 and the inverted muxing signal /MUX00.

For example, when the muxing signal MUX00 is at a high level, the transmission gates TG1 and TG2 are turned on and connect the I/O lines IO0 and IO0B and the DIO lines DI0 and DI0B. Also, when the muxing signal MUX00 is at a low level, the transmission gates TG1 and TG2 are turned off and disconnect the I/O lines IO0 and IO0B from the DIO lines DI0 and DI0B.

Also, drains of the NMOS transistors NP1 and NP2 are respectively connected to the I/O line IO0 and the I/O line IO0B and sources of the NMOS transistors NP1 and NP2 are connected to the ground voltage. The inverted muxing signal /MUX00 is input to gates of the NMOS transistors NP1 and NP2. The NMOS transistors NP1 and NP2 are turned on or off in response to the inverted muxing signal /MUX00.

For example, when the inverted muxing signal /MUX00 is at the high level, the NMOS transistors NP1 and NP2 are turned on and pre-discharge the I/O lines IO0 and IO0B to the ground voltage. Also, when the inverted muxing signal /MUX00 is at the low level, the NMOS transistors NP1 and NP2 are turned off.

Next, the I/O sense amplifier and driver SD0 second amplifies the read-out data signals received from the DIO lines DI0 and DI0B and outputs the resulting signals to the output buffer OB0. Also, the I/O sense amplifier and driver SD0 outputs the write data signal received from the input buffer IB0 to the DIO lines DI0 and DI0B.

The I/O precharge circuit PR0 is connected to the DIO lines DI0 and DI0B. In response to the control signals IPH0 and IPL0, the I/O precharge circuit PR0 pre-discharges the DIO lines DI0 and DI0B to the ground voltage or precharges the DIO lines DI0 and DI0B to the internal voltage VCC.

Figure 6:
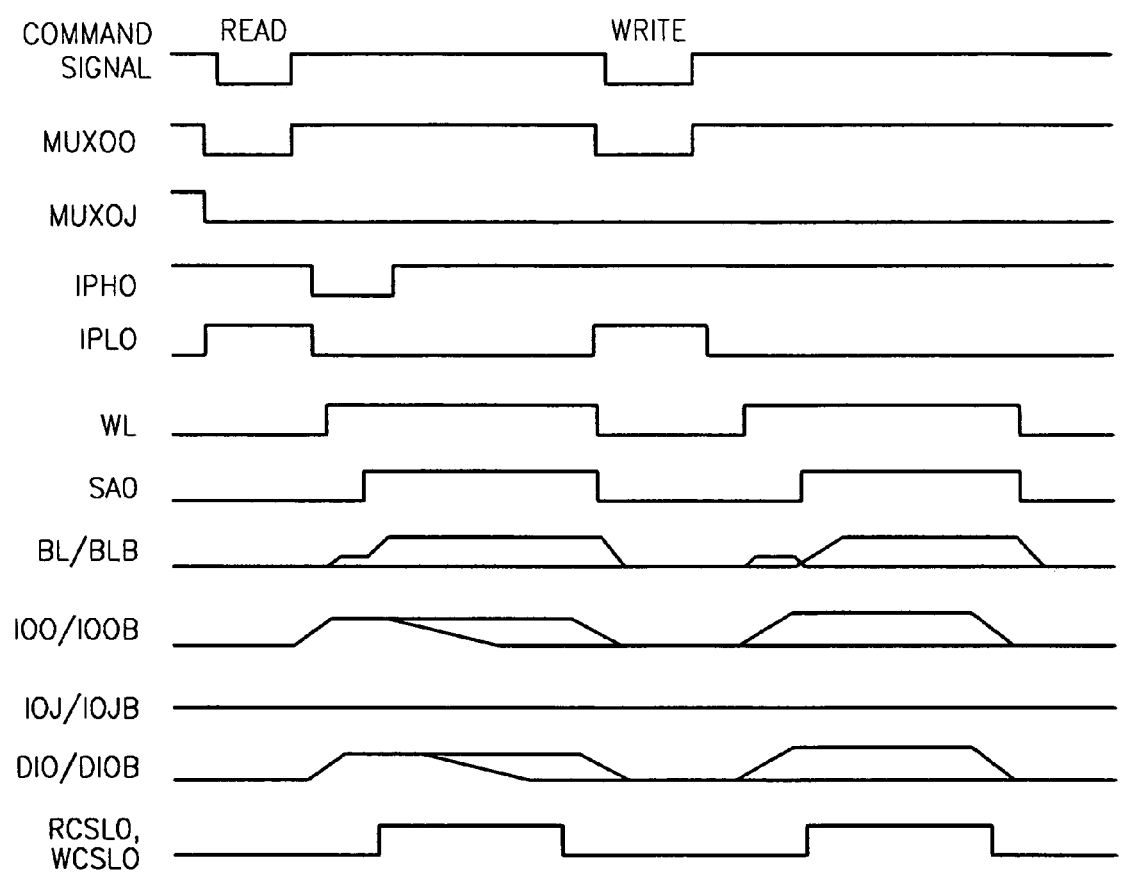
FIG. 6 is a timing diagram illustrating signals associated with the data I/O circuit of FIG. 5.

Next, referring to FIGS. 5 and 6, the detailed operation of the data I/O circuit 100 will be described. FIG. 6 is a timing diagram for main signals associated with the data I/O circuit 100 of FIG. 5.

First, considering the read operation of the data I/O circuit 100, muxing signals MUX00 through MUX0J and the control signal IPH0 are disabled and the control signal IPL0 is enabled, in an initial state.

Referring to FIG. 5, in response to the muxing signals MUX00 and MUX0J, transmission gates of TG1 through TG4 of the I/O line selection circuits SM0 and SMJ all are turned off and NMOS transistors NP1 through NP4 all are turned off. The transmission gates TG1 through TG4 disconnect the I/O lines IO0, IO0B and IOJ, IOJB from the DIO lines DI0 and DI0B.

The NMOS transistors NP1 through NP4 pre-discharge the I/O lines IO0, IO0B and IOJ, IOJB to the ground voltage. Also, in response to the control signal IPL0, the I/O precharge circuit PR0 pre-discharges the DIO lines DI0 and DI0B to the ground voltage.

Thereafter, when a read command signal READ is enabled, one of the muxing signals MUX00 through MUX0J and the control signal IPH0 are enabled and the control signal IPL0 is disabled. In this embodiment of the present invention, a case where the muxing signal MUX00 is enabled will be described as an example.

In response to the muxing signal MUX00, the transmission gates TG1 and TG2 of the I/O line selection circuit SM0 are turned on and the NMOS transistors NP1 and NP2 are turned off. The transmission gates TG1 and TG2 connect the I/O lines IO0 and IO0B to the DIO lines DI0 and DI0B. As a result, a data output path is formed by the bit line sense amplifying unit BS04, which are connected to the bit lines BL0 and BL0B, the I/O lines IO0 and IO0B, and the DIO lines DI0 and DI0B.

At this time, since the muxing signal MUX0J is being disabled, the I/O lines IOJ and IOJB continue to be pre-discharged to the ground voltage.

The column selection signal RCSL0 that is the same as that input to the bit line sense amplifying unit BS04 is input to the bit line sense amplifying unit BSJ4. Thus, when the gate circuit 113a of the bit line sense amplifying unit BS04 is turned on, the gate circuit 123a is also turned on. However, since the I/O lines IOJ and IOJB continue to be pre-discharged to the ground voltage, current does not flow through the I/O lines IOJ and IOJB. As a result, as shown in FIG. 6, a voltage difference does not occur between the I/O lines IOJ and IOJB.

Second, considering the write operation of the data I/O circuit 100, an initial state of the write operation is identical to that of the read operation and description will not be repeated.

After the initial state, once a write command signal WRITE is enabled, one of the muxing signals MUX00 through MUX0J is enabled and the control signal IPL0 is disabled. In this embodiment of the present invention, a case where the muxing signal MUX00 is enabled will be described as an example.

In response to the muxing signal MUX00, the transmission gates TG1 and TG2 of the I/O line selection circuit SM0 are turned on and the NMOS transistors NP1 and NP2 are turned off. The transmission gates TG1 and TG2 connect the I/O lines IO0 and IO0B to the DIO lines DI0 and DI0B. As a result, a data input path is formed by the bit line sense amplifying unit BS04, which are connected to the bit lines BL0 and BL0B, the I/O lines IO0 and IO0B, and the DIO lines DI0 and DI0B, At this time, since the muxing signal MUX0J is being disabled, the I/O lines IOJ and IOJB continue to be pre-discharged to the ground voltage. As a result, current does not flow through the I/O lines IOJ and IOJB. Thus, as shown in FIG. 6, a voltage difference does not occur between the I/O lines IOJ and IOJB.

The column selection signal WCSL0 that is the same as that input to the bit line sense amplifying unit BS04 is input to the bit line sense amplifying unit BSJ4. Thus, when the gate circuit 113b of the bit line sense amplifying unit BS04 is turned on, the gate circuit 123b of the bit line sense amplifying unit BSJ4 is also turned on.

However, since the I/O lines IOJ and IOJB continue to be pre-discharged to the ground voltage, current does not flow through the I/O lines IOJ and IOJB. Also, since the I/O lines IOJ and IOJB are at the ground voltage VSS level, the current blocking unit 125 of the gate circuit 123b is maintained in a turn-off state. Thus, a current path from the bit lines BLJ and BLJB to the I/O lines IOJ and IOJB is blocked by the current blocking unit 125. Hence, as shown in FIG. 6, a voltage difference does not occur between the I/O lines IOJ and IOJB.

Figure 7:
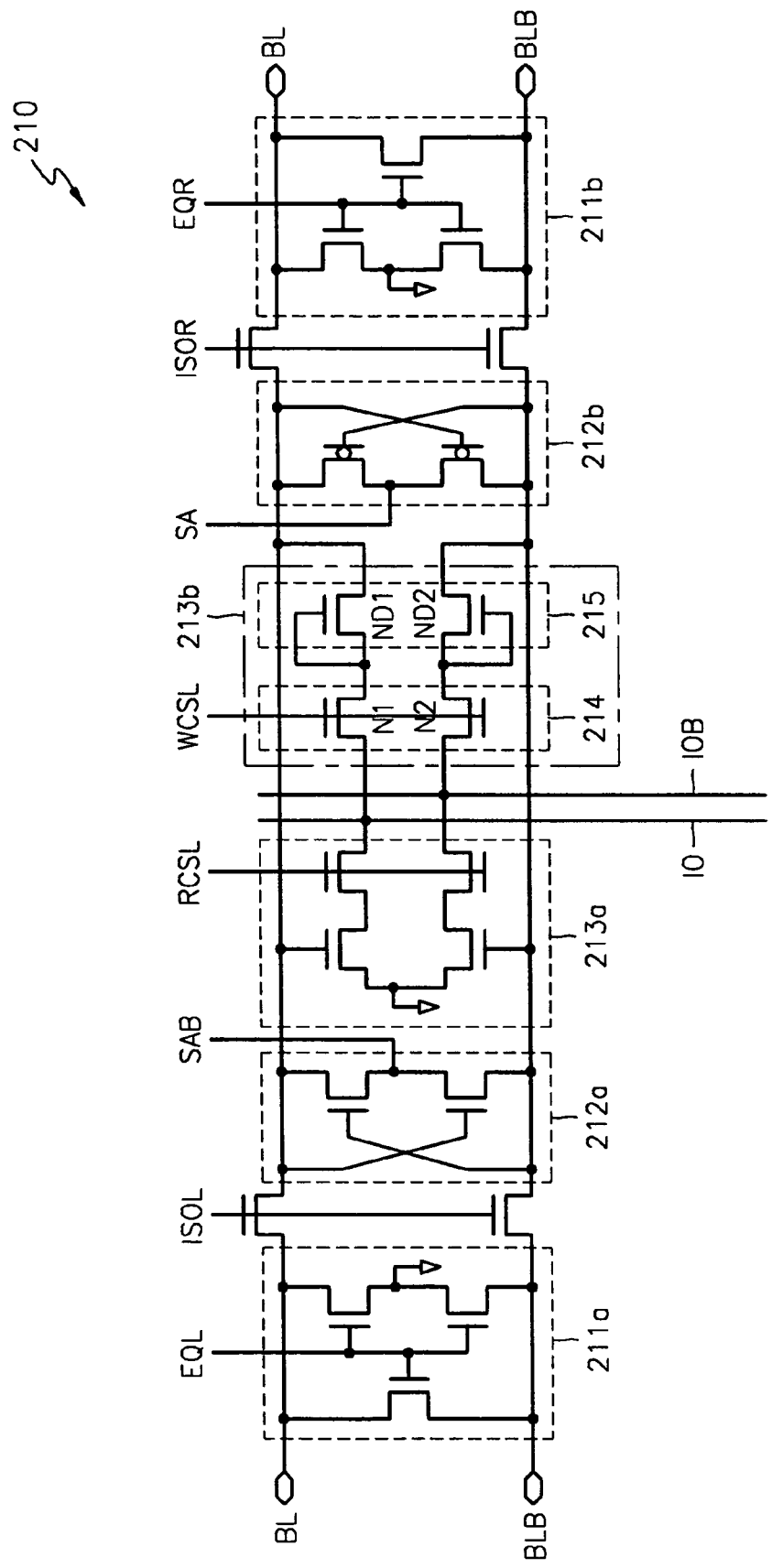
FIG. 7 illustrates a bit line sense amplifying unit according to another embodiment of the present invention.

FIG. 7 illustrates a bit line sense amplifying unit according to another embodiment of the present invention. In FIG. 7, since a bit line sense amplifying unit 210 is identical to the bit line sense amplifying units BS04 and BSJ4 of FIG. 5 except for a gate circuit 213b, description of the detailed configuration and operation of the bit line sense amplifying unit 210 will not be repeated.

The gate circuit 213b includes a gate unit 214 and a current blocking unit 215. The gate unit 214 includes NMOS transistors N1 and N2. The current blocking unit 215 includes NMOS transistors ND1 and ND2.

The NMOS transistors ND1 and ND2 are diode connected to output of the gate unit 214. Sources of the NMOS transistors ND1 and ND2 are connected to the bit lines BL and BLB and gates of the NMOS transistors ND1 and ND2 are connected to sources of the NMOS transistors N1 and N2.

Also, drains of the NMOS transistors N1 and N2 are connected to the I/O lines IO and IOB and the column selection signal WCSL is input to gates of the NMOS transistors N1 and N2. Here, when the column selection signal WCSL is enabled, it comes to have the internal voltage VCC level.

During the write operation, two cases can be considered as follows. One is when the column selection signal WCSL is enabled and the I/O lines IO and IOB are selected as the data output path by an I/O line selection circuit (SM0 of FIG. 5). The other is when the column selection signal WCSL is enabled and the I/O lines IO and IOB are not selected as the data output path by the I/O line selection circuit (SM0 of FIG. 5).

In the first case, it can be assumed that the I/O lines IO and IOB are selected as the data output path, the I/O line IO comes to have the internal voltage VCC level, and the I/O line IOB comes to have the ground voltage VSS level.

Then, in response to the column selection signal WCSL, the NMOS transistors N1 and N2 are turned on. At this time, the same voltage VCC is applied to drain and gate of the NMOS transistor N1. As a result, the voltage VCC of the I/O line IO drops to a first voltage VCC−Vt1 by the NMOS transistor N1 and the first voltage VCC−Vt1 is then applied to drain and gate of the NMOS transistor ND1.

The first voltage VCC−Vt1 drops to a second voltage VCC−(Vt1+Vt2) by the NMOS transistor ND1 and is then applied to the bit line BL. Here, Vt1 is a threshold voltage of the NMOS transistor N1 and Vt2 is a threshold voltage of the NMOS transistor ND1.

Also, since the NMOS transistor ND2 is being turned off, the bit line BLB is floated.

In the second case, it can be assumed that the I/O lines IO and IOB are not selected as the data output path.

In response to the column selection signal WCSL, the NMOS transistors N1 and N2 are turned on. At this time, the I/O lines IO and IOB are pre-discharged by the I/O line selection circuit SM0 and come to have the ground voltage VSS level.

Since the NMOS transistors ND1 and ND2 are maintained in a turn-off state, a current path from the bit lines BL and BLB to the I/O lines IO and IOB is blocked. Thus, power consumption caused by the bit lines BL and BLB and the I/O lines IO and IOB is reduced.

Figure 8:
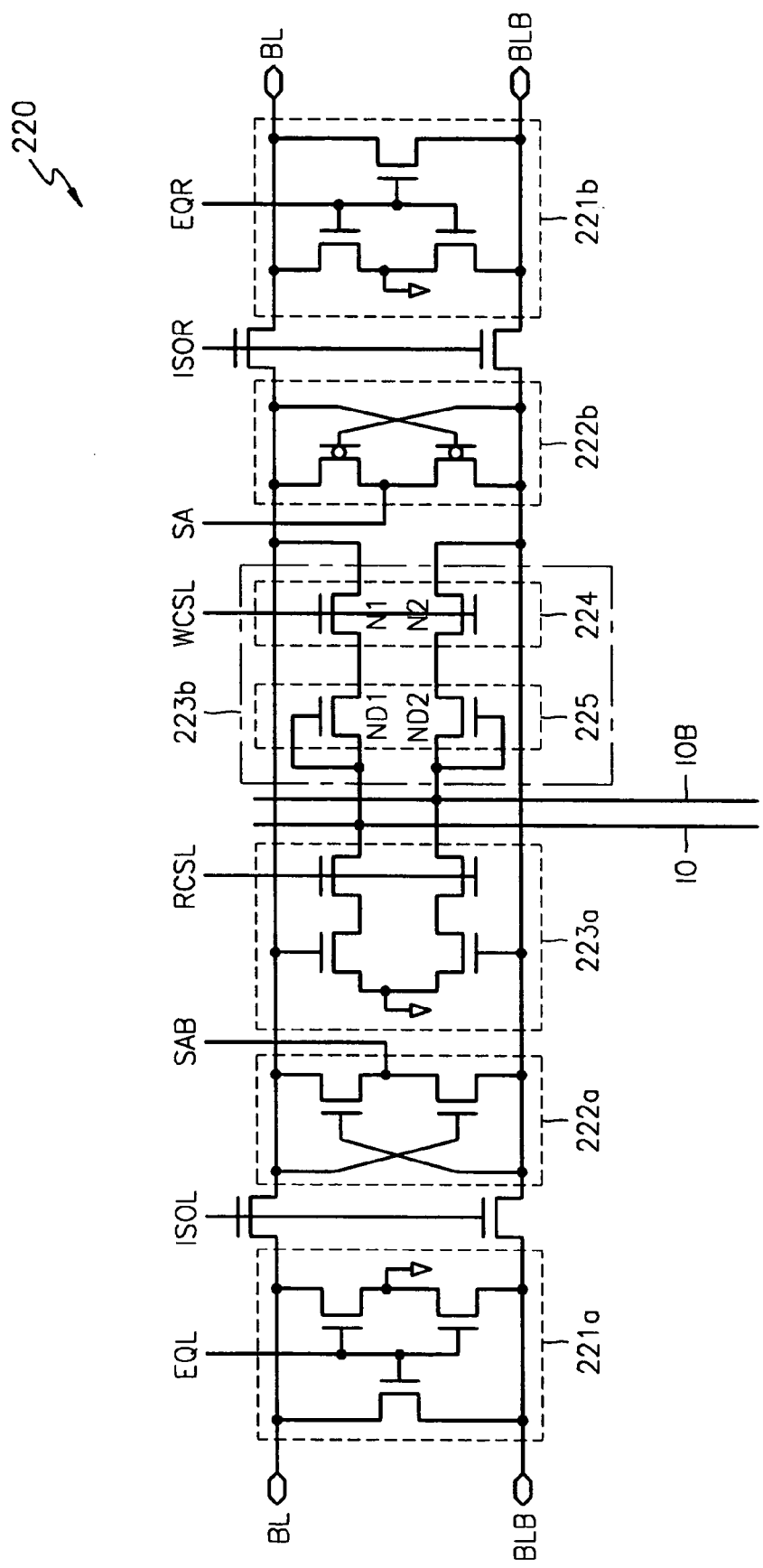
FIG. 8 illustrates a bit line sense amplifying unit according to yet another embodiment of the present invention.

FIG. 8 illustrates a bit line sense amplifying unit according to yet another embodiment of the present invention. In FIG. 8, since a bit line sense amplifying unit 220 is identical to the bit line sense amplifying unit 210 of FIG. 7 except for one difference, the detailed configuration and operation of the bit line sense amplifying unit 220 will not be described.

The difference between the bit line sense amplifying unit 220 and the bit line sense amplifying unit 210 is that the order of arrangement of a gate unit 224 and a current blocking unit 225 that are included in a gate circuit 223b of the bit line sense amplifying unit 220 is exchanged, so as to prevent a voltage level of the write data signal delivered from the I/O lines IO and IOB to the bit lines BL and BLB from dropping excessively. In other words, the current blocking unit 225 is connected to the I/O lines IO and IOB and the gate unit 224 is connected to the bit lines BL and BLB.

The gate unit 224 includes NMOS transistors N1 and N2 and the current blocking unit 225 includes NMOS transistors ND1 and ND2.

Sources of the NMOS transistors N1 and N2 are connected to the bit lines BL and BLB and drains of the NMOS transistors N1 and N2 are connected to sources of the NMOS transistors ND1 and ND2. Also, the column selection signal WCSL is applied to gates of the NMOS transistors N1 and N2. Here, when the column selection signal WCSL is enabled, it comes to have the internal voltage VCC level.

Also, the NMOS transistors ND1 and ND2 are diode connected to the I/O lines IO and IOB. Gates of the NMOS transistors ND1 and ND2 are connected to the I/O lines IO and IOB.

During the write operation, two cases can be considered. One is when the column selection signal WCSL is enabled and the I/O lines IO and IOB are selected as the data input path by an I/O line selection circuit (SM0 of FIG. 5). The other is when the column selection signal WCSL is enabled and the I/O lines IO and IOB are not selected as the data input path by the I/O line selection circuit (SM0).

In the first case, it can be assumed that the I/O lines IO and IOB are selected as the data input path, the I/O line IO has the internal voltage VCC level, and the I/O line IOB has the ground voltage VSS level.

In response to the column selection signal WCSL, the NMOS transistors N1 and N2 are turned on. The NMOS transistor ND1 is turned on because the I/O line IO is at the internal voltage VCC level. The NMOS transistor ND2 is turned off because the I/O line IOB is at the ground voltage VSS level.

The voltage VCC of the I/O line IO drops to the first voltage VCC−Vt by the NMOS transistor ND1 and the first voltage VCC−Vt is then applied to the drain of the NMOS transistor N1. Vt is a threshold voltage of the NMOS transistor ND1.

Since the voltage VCC applied to the gate of the NMOS transistor N1 is higher than the first voltage VCC−Vt applied to the drain of the NMOS transistor N1, the first voltage VCC−Vt is not dropped by the NMOS transistor N1 and is delivered to the bit line BL.

Also, since the NMOS transistor ND2 is being turned off, the bit line BLB is floated.

In the second case, it can be assumed that the I/O lines IO and IOB are not selected as the data input path.

Then, in response to the column selection signal WCSL, the NMOS transistors N1 and N2 are turned on. At this time, the I/O lines IO and IOB are pre-discharged by the I/O line selection circuit SM0 and come to have the ground voltage VSS level. As a result, since the NMOS transistors ND1 and ND2 are maintained in a turn-off state, a current path from the bit lines BL and BLB to the I/O lines IO and IOB is blocked. Thus, power consumption caused by the bit lines BL and BLB and the I/O lines IO and IOB is reduced.

As described above, a data I/O circuit of an embedded memory device and a data I/O method of the data I/O circuit according to the present invention can reduce power consumption caused by I/O lines that are not selected, during a read or write operation.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A data input/output circuit of an embedded memory device, which includes sub memory cell blocks that share word lines, the data input/output circuit comprising:
   input/output lines, each pair of which is arranged in each of the sub memory cell blocks;
   bit line sense amplifying unit groups, which are connected between the sub memory cell blocks and the input/output lines and mutually transmit data signals between the sub memory cell blocks and the input/output lines in response to first control signals; and
   data input/output units, wherein each data input/output unit comprises:
   a precharge/pre-discharge circuit;
   a data input/output line pair; and
   input/output line selection circuits each connected to the data input/output line pair, each data input/output unit being connected to an input/output line group, each input/output line group including a first predetermined number of pairs of input/output lines, wherein each data input/output unit selects as a data path some of the pairs of input/output lines included in the input/output line groups in response to second control signals, wherein each input/output line selection unit is connected between each of the first predetermined number of pairs of the input/output lines and the data input/output line pair, wherein in response to muxing signals of the second control signals, the input/output line selection circuits pre-discharge unselected pairs of input/output lines to a ground voltage and prevent current flow through the unselected pairs of input/output lines during an initial state of a read operation and a write operation, and, in response to input/output precharge control signals among the second control signals, the precharge/pre-discharge circuit pre-discharges the data input/output line pair to a ground voltage during the initial state of the read operation and the write operation, and wherein each data input/output unit receives and transmits the data signals to the sub memory cell blocks via the selected pairs of input/output lines.

2. The data input/output circuit of claim 1, wherein each of the data input/output units further comprises:
   input/output sense amplifiers and drivers, which amplify read-out data signals received via the data input/output line pair, output the amplified read-out data signals to output buffers, and output write data signals received from input buffers to the data input/output line pair, wherein
   the precharge/pre-discharge circuit precharges the data input/output line pair to an internal voltage or pre-discharges the data input/output line pair to the ground voltage, in response to the input/output precharge control signals among the second control signals, and
   wherein when one of the input/output line selection circuits is enabled, the residual input/output line selection circuits are disabled.

3. The data input/output circuit of claim 1, wherein the muxing signals are composed of combinations of column address signals.

4. The data input/output circuit of claim 1, wherein when each of the input/output line selection circuits is enabled, it connects a corresponding pair of input/output lines to the data input/output line pair, and when each of the input/output line selection circuits is disabled, it disconnects the corresponding pair of input/output lines from the data input/output line pair and pre-discharges the corresponding pair of input/output lines to the ground voltage.

5. The data input/output circuit of claim 4, wherein each of the input/output line selection circuits comprises:
   switching circuits, which are connected between the pairs of input/output lines and the data input/output line pair and are turned on or off in response to the muxing signals; and
   input/output pre-discharge circuits, which pre-discharge the pairs of input/output lines to the ground voltage in response to the muxing signals when the switching circuits are turned off.

6. The data input/output circuit of claim 5, wherein the switching circuits are transmission gates.

7. The data input/output circuit of claim 4, wherein the bit line sense amplifying unit groups share a second predetermined number of column selection lines and each comprise the second predetermined number of bit line sense amplifying units, each of which is connected to bit lines of the sub memory cell blocks and to an input/output line pair among the first predetermined number of pairs of input/output lines, and
   during the write operation, the second predetermined number of bit line sense amplifying units block a current path formed between the bit lines and the input/output line pair when the input/output line pair is not selected as a data input path by the input/output line selection circuits.

8. The data input/output circuit of claim 7, wherein each of the second predetermined number of bit line sense amplifying units comprises:
   bit line precharge circuits, which are connected to a pair of bit lines among the bit lines and precharge the pair of bit lines to a predetermined voltage;
   sense amplifying circuits, which amplify a voltage of the pair of bit lines;
   a first gate circuit, which, during a read operation, is enabled in response to a first column selection signal and provides a current corresponding to a voltage difference between the pair of bit lines to the input/output line pair to which each of the second number of bit sense amplifying units is connected; and
   a second gate circuit, which, during the write operation, is enabled in response to a second column selection signal and delivers a write data signal received from the input/output line pair to the pair of bit lines,
   wherein when the input/output line pair is not selected as the data input path, the second gate circuit blocks a current path formed between the pair of bit lines and the input/output line pair.

9. The data input/output circuit of claim 8, wherein the second gate circuit comprises:
   a gate unit, which is enabled in response to the second column selection signal and delivers the write data signal to the pair of bit lines; and
   a current blocking unit, which is connected between the input/output line pair to which each of the second number of bit sense amplifying units is connected and the gate unit, delivers the write data signal received from the input/output line pair to the gate unit when the input/output line pair is selected as the data input path, and blocks a current path from the pair of bit lines to the input/output line pair when the input/output line pair is not selected as the data input path.

10. The data input/output circuit of claim 9, wherein the current blocking unit comprises a plurality of NMOS transistors that are cross coupled to the input/output line pair.

11. The data input/output circuit of claim 9, wherein the current blocking unit comprises a plurality of NMOS transistors that are diode connected to the input/output line pair.

12. The data input/output circuit of claim 8, wherein the second gate circuit comprises:
   a gate unit, which is enabled in response to the second column selection signal and receives the write data signal from the input/output line pair; and
   a current blocking unit, which is connected between the gate unit and the pair of bit lines, delivers the write data signal received from the gate unit to the pair of bit lines when the input/output line pair is selected as the data input path, and blocks a current path from the pair of bit lines to the input/output line pair when the input/output line pair is not selected as the data input path.

13. The data input/output circuit of claim 12, wherein the current blocking unit comprises a plurality of NMOS transistors that are diode connected to output of the gate unit.

14. An embedded memory device comprising a data input/output circuit, wherein the data input/output circuit comprises:
   input/output lines, each pair of which is arranged in each of the sub memory cell blocks;
   bit line sense amplifying unit groups, which are connected between the sub memory cell blocks and the input/output lines and transmit data signals between the sub memory cell blocks and the input/output lines in response to first control signals; and
   data input/output units, wherein each data input/output unit comprises:
      a precharge/pre-discharge circuit;
      a data input/output line pair; and
      input/output line selection circuits each connected to the data input/output line pair, each data input/output unit being connected to an input/output line group, each input/output line group including a first predetermined number of pairs of the input/output lines, wherein each data input/output unit selects some of the input/output lines as a data path in response to second control signals, wherein each input/output line selection unit is connected between each of the first predetermined number of pairs of the input/output lines and the data input/output line pair, wherein in response to muxing signals of the second control signals, the input/output line selection circuits pre-discharge unselected pairs of input/output lines to a ground voltage and prevent current flow through the unselected pairs of input/output lines during an initial state of a read operation and a write operation, and in response to input/output precharge control signals among the second control signals, the precharge/pre-discharge circuit pre-discharges the data input/output line pair to a ground voltage during the initial state of the read operation and the write operation, and wherein each data input/output unit receives and transmits the data signals to the sub memory cell blocks via the selected input/output lines.

15. A data input/output method executed in a data input/output circuit that includes pairs of input/output lines and a data input/output line pair, each pair of input/output lines being arranged in each of sub memory cell blocks that share word lines, bit line sense amplifying unit groups that are each connected between bit lines of each of the sub memory cell blocks and a pair of input/output lines corresponding to each of the sub memory cell blocks and transmit data signals between the sub memory cell blocks and the input/output lines in response to first control signals, and data input/output units, wherein each data input/output unit comprises input/output line selection circuits that are connected to a first predetermined number of pairs of input/output lines and are connected to the data input/output line pair, the data input/output method comprising:

(a) connecting each input/output line selection unit between each of the first predetermined number of pairs of input/output lines and the data input/output line pair;

(b) during an initial state of read operation and a write operation, the input/output line selection circuits pre-discharging all the input/output lines to a ground voltage in response to muxing signals of second control signals, and pre-discharging the data input/output line pair to a ground voltage in response to input/output precharge control signals among the second control signals;

(c) when a read command signal during a read operation is enabled and a write command signal during a write operation is enabled, selecting some of the pairs of input/output lines as a data input/output path and pre-charging the selected pairs of input/output lines to an internal voltage;

(d) continuing to pre-discharge unselected pairs of input/output lines that are not selected as the data input/output path in step (c) to the ground voltage and prevent current flow through the unselected pairs of input/output lines during the initial state of the read operation and the write operation in response to the muxing signals of the second control signals;

(e) when an additional read command signal or an additional write command signal is enabled, repeating steps (c) and (d);

(f) receiving and transmitting the data signals to the sub memory cell blocks via the selected input/output lines.

16. The data input/output method of claim 15, further comprising, (e) when the write command signal is enabled in step (b), blocking a current path formed between the bit lines and the input/output lines that are not selected as the data input/output path.

* * * * *